United States Patent [19]

Shi et al.

[11] Patent Number: 5,677,545
[45] Date of Patent: Oct. 14, 1997

[54] ORGANIC LIGHT EMITTING DIODES WITH MOLECULAR ALIGNMENT AND METHOD OF FABRICATION

[75] Inventors: Song Q. Shi, Phoenix; Franky So, Tempe; Thomas B. Harvey, III, Scottsdale, all of Ariz.

[73] Assignee: Motorola, Schaumburg, Ill.

[21] Appl. No.: 304,449

[22] Filed: Sep. 12, 1994

[51] Int. Cl.$^6$ ................................................. H01L 35/24
[52] U.S. Cl. ........................... 257/40; 257/103; 313/504; 313/506; 428/917; 252/301.16; 252/301.33; 252/301.6 R
[58] Field of Search ................ 257/103, 40; 313/504, 313/506; 315/169.3; 428/917; 252/301.6 R, 301.33, 301.16

[56] References Cited

U.S. PATENT DOCUMENTS 4,775,820  10/1988  Eguchi et al. .......................... 313/504

OTHER PUBLICATIONS

T. Nonaka, "Fabrication of an Organic Superlattice Film by Molecular Beam Deposition", J. Appl. Phys. 73(6), Mar. 15, 1993, pp. 2826–2830.

Katsuo Orihara, "Fabrication of an Organic–Inorganic Pseudosuperlattice", Thin Solid Films 219 (1992) pp. 236–238. no month.

G. Grem et al, "Blue Electroluminescent Device Based on a Conjugated Polymer", Synthetic Metals, 51 (1992), pp. 383–389. no month.

Takakazu Yamamoto et al., "π-Conjugated Poly(pyridine-2, 5-diyl), Poly (2,2'-bipyridine-5,5'-diyl), and Their Alkyl Derivatives. Preparation, Linear Structure, Function as a Ligand to Form Their Transition Metal Complexes, Catalytic Reactions, n–Type Electrically Conducting Properties, Optical Properties, and Alignment on Substrates." J. Am. Chem. Soc. 1994, vol. 116, No. 11, pp. 4832–4845. No month.

V. L. Colvin et al., "Light Emitting Diodes Made With Cadmium Selenide Nanocrystals" Letters to Nature, Jan. 25, 1994.

V. L. Colvin et al., "Semiconductor Nanocrystals Covalently Bound to Metal Surfaces with Self-Assembled Monolayers", J. Am. Chem. Soc., 1992, vol. 114, No. 13, pp. 5221–5230. no month.

C. B. Murray et al., "Synthesis and Characterization of Nearly Monodisperse CdE (E=S, Se, Te) Semiconductor Nanocrystallites", J. Am. Chem. Soc. 1993, vol. 115, pp. 8706–8715.

*Primary Examiner*—Jerome Jackson
*Assistant Examiner*—John Guay
*Attorney, Agent, or Firm*—Eugene A. Parsons

[57] ABSTRACT

An organic LED including a conductive layer with a planar surface and a layer of semiconductive polymer molecules having anchoring groups at each end, uniformly oriented perpendicularly on the planar surface, by deposition and self-assembly technique. A coupling layer positioned on the organic layer and a second organic layer uniformly oriented on the coupling layer, by deposition and self-assembly technique, parallel to the first semiconductive polymer molecules. Additional coupling layers and organic layers are alternately positioned on the second organic layer and on each other to form an LED of desired dimensions and a second conductive layer is deposited on the final layer.

20 Claims, 1 Drawing Sheet

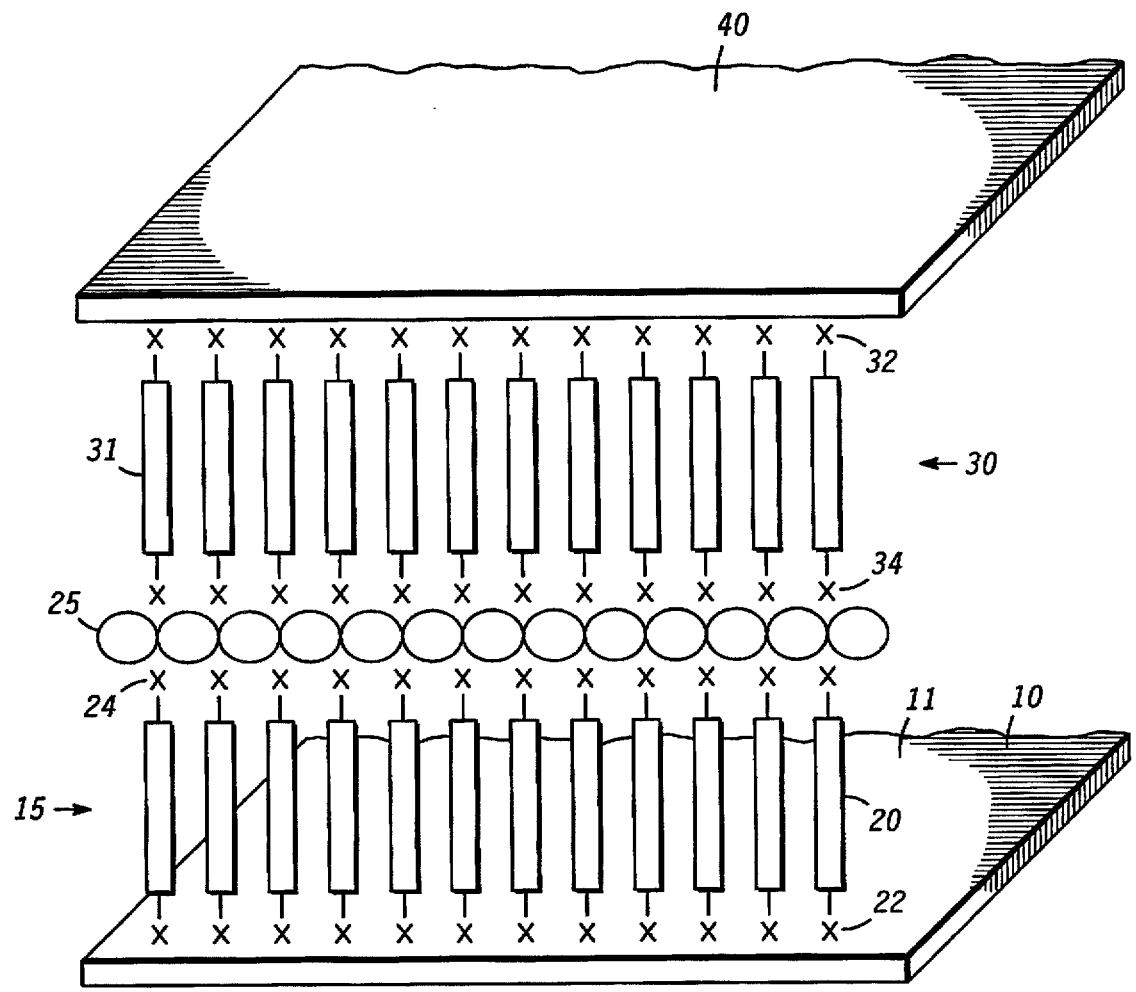

ORGANIC LIGHT EMITTING DIODES WITH MOLECULAR ALIGNMENT AND METHOD OF FABRICATION

BACKGROUND OF THE INVENTION

In all organic light emitting devices (LED), organic layers are formed by either thermal evaporation or spin-coating the organic material on a substrate. The resulting organic layers are either amorphous or random oriented polycrystalline solids. As a result, the charge carrier mobilities in the organic layers are normally generally low, typically less than $10^{-4}$ cm$^2$/Vs. Injection current (J) is proportional to the carrier mobility (μ), as stated in the relationship:

$$J = \epsilon \mu (V^2/d^3).$$

Where
ε is the dielectric constant of the organic layer;
V is a voltage applied across the organic layer; and
d is the thickness of the organic layer.
Therefore, the low carrier mobility is one of the limiting factors for the injection current, which in turn limits the maximum brightness for organic LED displays and specifically for direct view organic LED displays.

It is desirable to fabricate organic LEDs with sufficient carrier mobility to provide the brightness to be usable in direct view displays.

It is a purpose of the present invention to provide organic LEDs having improved carrier mobility.

It is another purpose of the present invention to provide methods of fabricating organic LEDs with improved carrier mobility.

A further purpose of the present invention is to provide methods of fabricating organic LEDs with improved carrier mobility, which methods are relatively simple and inexpensive.

A still further purpose of the present invention is to provide methods of fabricating organic LEDs with improved carrier mobility, which fabrication method is engineered at the molecular level with good control over the dimensions.

Another purpose of the present invention is to provide methods of fabricating organic LEDs with improved carrier mobility, which fabrication method includes manipulating the size and kind of organic molecules as well as interspersed coupling layers so that full color and a desired amount of fluorescence can be achieved.

SUMMARY OF THE INVENTION

The above problems and others are at least partially solved and the above purposes and others are realized in an organic light emitting diode including a first conductive layer of electrically conducting material having a planar surface and a first organic layer of semiconductive polymer molecules having anchoring groups at each end positioned on the planar surface of the first conductive layer by deposition and self-assembly technique to substantially uniformly orient the semiconductive polymer molecules perpendicular to the planar surface.

A first coupling layer is positioned on the first organic layer and a second organic layer of semiconductive polymer molecules having anchoring groups at each end is positioned on the first coupling layer by deposition and self-assembly technique to substantially uniformly orient the semiconductive polymer molecules parallel to the semiconductive polymer molecules of the first organic layer.

Additional coupling layers and organic layers are alternately positioned on the second organic layer and on each other, to achieve desired dimensions and brightness.

A second conductive layer of electrically conducting material is positioned on the final organic layer to complete the LED. Generally, one of the first and second conductive layers is light transmissive to allow emission of the generated light.

BRIEF DESCRIPTION OF THE DRAWING

Referring to the single FIGURE, an organic light emitting device fabricated in accordance with the present invention is illustrated.

DESCRIPTION OF THE PREFERRED EMBODIMENTS

Referring specifically to the FIGURE, a first conductive layer 10 of electrically conductive material is illustrated with a substantially planar surface 11. A first organic layer 15 is positioned on conductive layer 10. Organic layer 15 is composed of semiconductive polymer molecules 20, with each molecule 20 including an anchoring group 22 and 24 at each end thereof, respectively. In the FIGURE, anchoring group 22 of each molecule 20 is anchored to planar surface 11 of conductive layer 10.

Semiconductive polymer molecules 20 can include virtually any elongated hydrocarbon-like molecules containing conjugated double bonds and may include one or more ring structures (e.g. phenyl, naphthyl, etc.) as a stiffener. Generally, the molecules selected should be long enough to form a relatively good semiconductor while being sufficiently elongated to be oriented perpendicular to the plane on which they are deposited. Also, the term "semiconductive polymer molecules" is defined to include any polymer, oligomer or semiconductive organic material which will perform the functions described herein. Further, depending upon the specific application, molecules 20 can be fluorescent and/or relatively good semiconducting (conducting) material. This option will be discussed in more detail presently.

As stated above, each molecule 20 includes an anchoring group 22 and 24 at each end thereof. Anchoring groups 22 and 24 are also selected in accordance with the specific embodiment being constructed and the specific application. Generally, the anchoring group should chemically bond well with molecule 20 and also chemically bond well with conductive layer 10 or other material to be described presently. Typical examples of anchoring groups include: thiols (—SH); hydroxy (—OH); amine (—NH$_2$); carboxylic acid (—CO$_2$H); sulfonic acid (—SO$_3$H); phosphonic acid (—PO$_3$H$_2$); Si(OH)$_x$; etc.

By tailoring molecules 20 and anchoring groups 22 and 24, organic layer 15 can be formed to emit any desired color. Several examples of semiconductive polymer molecules with anchoring groups at each end which emit blue, green and red light are:

(blue color)

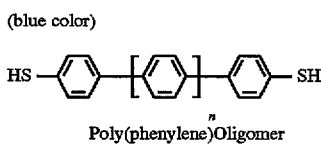

Poly(phenylene)Oligomer (green color)

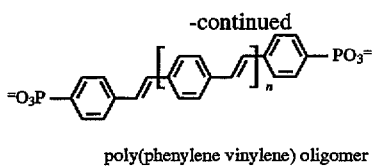

poly(phenylene vinylene) oligomer (red color)

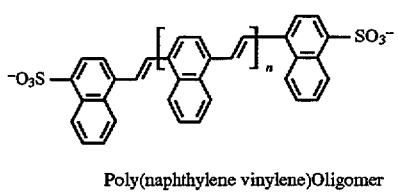

Poly(naphthylene vinylene)Oligomer

Molecules 20 are positioned on planar surface 11 of conductive layer 10 by deposition and a self-assembly technique so as to substantially uniformly orient each semiconductive polymer molecule 20 perpendicular to planar surface 11. Thus, anchoring group 24 at the opposite end of each molecule 20 is directed outwardly away from planar surface 11 and all of anchoring groups 24 generally cooperate to form a surface generally parallel to and spaced from planar surface 11.

Several self-assembly methods of making monolayers of organic compounds are known. One typical example is accomplished by using hydrophilic groups as the anchoring groups. Using the Langmuir-Blodgett approach, a layer of semiconductive polymer molecules with hydrophilic anchoring groups is floated on the surface of water. Because of the hydrophilic anchoring groups at the ends of the elongated semiconductive polymer molecules, the molecules are self oriented generally perpendicular to the surface of the water. The layer of correctly oriented molecules is then transferred to a desired surface by dipping the surface into the water. Perpendicularly oriented molecules can also self assemble directly on solid surfaces from solutions.

At least one method of self-assembly includes alternate deposition of monolayers of positively and negatively charged polymers. This layer-by-layer deposition process is carried out with dilute solutions of the charged polymers and is an extremely simple and effective way to produce thin films with structures that are controllable at the molecular level. One simply dips planar surface 11 of layer 10 into a solution containing a positively charged polymer, rinses surface 11 with water and then dips it into a solution containing a negatively charged polymer. In each dip, a highly uniform monolayer of the polymer in solution is deposited onto surface 11 with a thickness and chain conformation that is determined by such parameters as the solution pH, ionic strength and concentration.

A major problem with this, and other self-assembly processes is that only a thin film of material, generally in the range of 10–50 angstroms, can be produced. It will be understood that organic layer 15 includes one or more monolayers of molecules deposited by one or more self-assembly techniques, all of which are represented by molecules 20. With molecules 20 deposited to a desired (or maximum) height, a first coupling layer 25 is deposited onto organic layer 15 generally on anchoring groups 24.

Coupling layer 25 includes, for example, nanocrystals and or multi-valent ions. As a specific example, when multi-valent ions are included the ions chemically bond with the free bonds of one or more anchoring groups in layer 15 and have additional free bonds to chemically bond with free bonds of one or more anchoring groups of a second organic layer 30. In some instances, (e.g. extremely long semiconductor polymer molecules) it may be advantageous to have multi-valent ions that form more than one bond with one or more anchoring group to provide additional lateral support for the entire structure. Coupling layer 25 is formed in physical contact with anchoring group 24 and acts as a bridge between organic layer 15 and second organic layer 30. Second organic layer 30 is similar to organic layer 15 and generally will be formed utilizing semiconductive polymer molecules 31 with anchoring groups 32 and 34 at each end of each molecule 31. In this example, anchoring group 34 is chemically bonded to coupling layer 25 and anchoring group 32 is free.

Coupling layer 25 will generally be an inorganic material and may be a fluorescent or a non-fluorescent material and/or a relatively good conductor. Again, coupling layer 25 will be tailored, with semiconductor polymer layers 15 and 30, to provide the desired amount of conduction, fluorescence and color. In a specific embodiment, coupling layer 25 includes any of multi-valent ions, such as $Zr^{4+}$, $Zn^{2+}$, $Ca^{2+}$, etc. and nanocrystals of a material such as CdSe, CdTe, CdS, ZnS, etc. In the case of nanocrystals, color emission can be tuned by the size of the nanocrystals (see for example, copending patent application entitled "A Fluorescent Device With Quantum Contained Particle Screen", Ser. No. 08/055, 889, filed May 4, 1993 and assigned to the same assignee). For example, CdSe nanocrystals with a size less than approximately 16 angstroms emit blue light. CdSe nanocrystals with a size in the range of approximately 23–32 angstroms emit green light. CdSe nanocrystals with a size in the range of approximately 43–65 angstroms emit red light.

A conducting layer 40 of metal or other conducting material is deposited over organic layer 30 so that anchoring group 34 chemically bonds with the lower surface of conducting layer 40 and to substantially complete the organic LED. Generally, either conducting layer 10 or conducting layer 40 is a light transmissive material, such as indium-tin-oxide (ITO), or in some fashion allows light to be emitted therethrough. In some applications, very thin layers of metal are sufficiently transparent to allow the emission of sufficient light from the organic LED.

In this specific embodiment, because of the heat required in laying down a layer of ITO, layer 10 is a layer of ITO deposited on a glass substrate (not shown) and forms a first electrical contact for the LED. Organic layer 15 is then deposited on conducting layer 10 to a desired number of monolayers of semiconductive polymer molecules. Coupling layer 25 is deposited on organic layer 15 and a second organic layer 30 is deposited on coupling layer 25. Additional coupling layers and organic layers are alternately deposited on the structure to attain the desired thickness. Typical thicknesses of the organic layer (i.e. layers 15, 25, 30 and any additional layers) in organic light emitting diodes is in the range of approximately 300–5000 angstroms with the preferred embodiments generally lying in a range of approximately 500–1500 angstroms. Conducting layer 40, formed of a metal which can be deposited at a relatively low temperature, is then deposited on the final organic layer to form a second electrical contact for the LED. Generally, substrate heating during evaporation deposition procedures must be held below the temperature at which the organic layers will suffer damage.

In many applications a plurality of organic LEDs will be fabricated on a single substrate. In such instances, the procedure is substantially the same except that the LEDs are isolated by some convenient method, such as selective depositions or selective etching. Further, conducting layers 10 and 40 can be formed in rows and columns with an organic LED fabricated between each cross-over area to form large addressable arrays of LEDs.

Substantially all of the semiconductive polymer molecules in each layer of the LED are uniformly oriented perpendicular to the plane of the conducting layers 10 and 40. This specific orientation greatly increases the carrier mobility and, hence, the injection current. Because the fabrication method is engineered at the molecular level with good control over the dimensions, the dimensions can be easily and inexpensively adjusted to achieve a desired injection current and brightness. For example, sufficient brightness can be achieved to fabricate arrays of organic LEDs for direct view displays. Further, the disclosed fabrication method includes manipulating or tailoring the size and kind of semiconductive polymer molecules as well as the size of interspersed coupling layers and particles so that full color and a desired fluorescence can be achieved.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. An organic light emitting diode comprising:

a first conductive layer of electrically conducting material having a planar surface;

a first organic layer of semiconductive polymer molecules each having anchoring groups at each end positioned on the planar surface of the first conductive layer by deposition and a self-assembly technique to substantially uniformly orient the semiconductive polymer molecules perpendicular to the planar surface;

a first coupling layer positioned on the first organic layer;

a second organic layer of semiconductive polymer molecules having anchoring groups at each end positioned on the first coupling layer by deposition and self-assembly technique to substantially uniformly orient the semiconductive polymer molecules parallel to the semiconductive polymer molecules of the first organic layer; and a second conductive layer of electrically conducting material positioned in electrical contact with the second organic layer.

2. An organic light emitting diode as claimed in claim 1 wherein the first and second layers of semiconductive polymer molecules each include unsaturated polymers.

3. An organic light emitting diode as claimed in claim 1 wherein the first and second layers of semiconductive polymer molecules each include conjugated polymers.

4. An organic light emitting diode as claimed in claim 1 wherein the first coupling layer includes multi-valent ion material.

5. An organic light emitting diode as claimed in claim 1 wherein the first coupling layer includes nanocrystals.

6. An organic light emitting diode as claimed in claim 5 wherein the first coupling layer includes CdS nanocrystals.

7. An organic light emitting diode as claimed in claim 1 wherein one of the first and second conductive layers includes a light transparent material.

8. An organic light emitting diode as claimed in claim 7 wherein the light transparent material is ITO.

9. An organic light emitting diode as claimed in claim 1 wherein the coupling layer forms a bridge between the anchoring groups at one end of the semiconductive polymer molecules of organic layers on each side of the coupling layer.

10. An organic light emitting diode as claimed in claim 1 wherein the first and second organic layers of semiconductive polymer molecules include a plurality of monolayers of semiconductive polymer molecules.

11. An organic light emitting diode comprising:

a first conductive layer of electrically conducting material having a planar surface;

a first organic layer of semiconductive polymer molecules having anchoring groups at each end positioned on the planar surface of the first conductive layer by deposition and self-assembly technique to substantially uniformly orient the semiconductive polymer molecules perpendicular to the planar surface;

a first coupling layer positioned on the first organic layer;

a second organic layer of semiconductive polymer molecules having anchoring groups at each end positioned on the first coupling layer by deposition and self-assembly technique to substantially uniformly orient the semiconductive polymer molecules parallel to the semiconductive polymer molecules of the first organic layer;

additional coupling layers and organic layers alternately positioned on the second organic layer and on each other with a final layer; and a second conductive layer of electrically conducting material positioned on the final layer.

12. An organic light emitting diode as claimed in claim 11 wherein the first and second layers of semiconductive polymer molecules each include unsaturated polymers.

13. An organic light emitting diode as claimed in claim 11 wherein the first and second layers of semiconductive polymer molecules each include conjugated polymers.

14. An organic light emitting diode as claimed in claim 11 wherein the first coupling layer includes multi-valent ion material and CdS nanocrystals.

15. An organic light emitting diode as claimed in claim 11 wherein one of the first and second conductive layers includes a light transparent material.

16. An organic light emitting diode as claimed in claim 15 wherein the light transparent material is ITO.

17. An organic light emitting diode as claimed in claim 11 wherein the coupling layer forms a bridge between the anchoring groups at one end of the semiconductive polymer molecules of organic layers on each side of the coupling layer.

18. An organic light emitting diode as claimed in claim 11 wherein the first, second and additional organic layers of semiconductive polymer molecules include a plurality of monolayers of semiconductive polymer molecules.

19. An organic light emitting diode as claimed in claim 11 wherein at least one of the first, second and additional organic layers include a fluorescent semiconductive polymer material.

20. An organic light emitting diode as claimed in claim 11 wherein at least one of the first and additional coupling layers include a fluorescent nanocrystal material.

* * * * *